(12) United States Patent
Varunjikar et al.

(10) Patent No.: US 12,258,014 B2
(45) Date of Patent: Mar. 25, 2025

(54) VEHICULAR CONTROL SYSTEM WITH ENHANCED LANE CENTERING

(71) Applicant: Magna Electronics Inc., Auburn Hills, MI (US)

(72) Inventors: Tejas Murlidhar Varunjikar, Troy, MI (US); Arpit Awathe, Auburn Hills, MI (US); Subhabrata Ganguli, Northville, MI (US)

(73) Assignee: Magna Electronics Inc., Auburn Hills, MI (US)

( * ) Notice: Subject to any disclaimer, the term of this patent is extended or adjusted under 35 U.S.C. 154(b) by 237 days.

(21) Appl. No.: 18/050,131

(22) Filed: Oct. 27, 2022

(65) Prior Publication Data
US 2023/0134480 A1    May 4, 2023

Related U.S. Application Data

(60) Provisional application No. 63/263,177, filed on Oct. 28, 2021.

(51) Int. Cl.
*B60W 30/12* (2020.01)
*B60W 50/06* (2006.01)
*G06F 30/20* (2020.01)

(52) U.S. Cl.
CPC ............ *B60W 30/12* (2013.01); *B60W 50/06* (2013.01); *G06F 30/20* (2020.01); *B60W 2520/00* (2013.01)

(58) Field of Classification Search
CPC ...... G06F 30/20; B62D 15/025; B60W 10/06; B60W 10/18; B60W 10/20;
(Continued)

(56) References Cited

U.S. PATENT DOCUMENTS 4,633,423 A * 12/1986 Bailey ..................... G01P 3/489
                                                              318/632
5,189,621 A *  2/1993 Onari .................. B60K 31/0008
                                                              123/480

(Continued)

FOREIGN PATENT DOCUMENTS

KR        20150057537        5/2015

*Primary Examiner* — Carl C Staubach
(74) *Attorney, Agent, or Firm* — HONIGMAN LLP

(57) ABSTRACT

A method for enhancing a vehicular driving assistance system includes obtaining in-vehicle test data representative of performance of the vehicular driving assistance system of a vehicle during operation of the vehicular driving assistance system and determining, using the in-vehicle test data, a second order transfer function that models operation of the vehicular driving assistance system. The second order transfer function matches a magnitude response of the in-vehicle test data. The method includes providing a simulation environment. The simulation environment simulates the vehicular driving assistance system using the second order transfer function. The method includes determining, using the simulation environment, a feedforward contribution and a feedback contribution of the vehicular driving assistance system, and enhancing the vehicular driving assistance system based on adjustment of the feedforward contribution and the feedback contribution of the vehicular driving assistance system.

18 Claims, 21 Drawing Sheets

(58) Field of Classification Search
CPC . B60W 2050/0075; B60W 2050/0088; B60W 2520/00; B60W 30/12; B60W 50/06
See application file for complete search history.

(56) References Cited

U.S. PATENT DOCUMENTS

| | | | |
|---|---|---|---|
| 5,550,677 A | 8/1996 | Schofield et al. | |
| 5,670,935 A | 9/1997 | Schofield et al. | |
| 5,949,331 A | 9/1999 | Schofield et al. | |
| 6,401,016 B1* | 6/2002 | Yoshino | B60L 50/61 |
| | | | 477/3 |
| 7,038,577 B2 | 5/2006 | Pawlicki et al. | |
| 7,720,580 B2 | 5/2010 | Higgins-Luthman | |
| 7,855,755 B2 | 12/2010 | Weller et al. | |
| 8,155,839 B2* | 4/2012 | Nakano | B62D 6/003 |
| | | | 701/42 |
| 8,868,221 B1* | 10/2014 | Mealy | G05B 13/027 |
| | | | 706/14 |
| 9,873,450 B2* | 1/2018 | Pramod | B62D 5/0481 |
| 10,071,687 B2 | 9/2018 | Ihlenburg et al. | |
| 10,099,614 B2 | 10/2018 | Diessner | |
| 10,424,136 B2* | 9/2019 | Oh | B60K 6/48 |
| 10,841,571 B2 | 11/2020 | Sigle | |
| 10,870,400 B2 | 12/2020 | Thomas et al. | |
| 11,110,794 B2* | 9/2021 | Yokota | B61H 1/00 |
| 11,403,857 B2 | 8/2022 | Sathyanarayana et al. | |
| 11,609,304 B2 | 3/2023 | Kunkel | |
| 11,620,522 B2 | 4/2023 | Potnis | |
| 11,643,104 B2 | 5/2023 | Ustunel | |
| 11,745,749 B2 | 9/2023 | Potnis | |
| 2009/0012669 A1* | 1/2009 | Takenaka | B60W 10/20 |
| | | | 701/31.4 |
| 2010/0152952 A1* | 6/2010 | Lee | B62D 15/025 |
| | | | 701/41 |
| 2013/0261897 A1* | 10/2013 | Potter | B62D 15/02 |
| | | | 701/42 |
| 2016/0210775 A1 | 7/2016 | Alaniz et al. | |
| 2017/0306874 A1* | 10/2017 | Wu | G01M 17/0072 |
| 2019/0138432 A1 | 5/2019 | Nagaraj et al. | |
| 2019/0146492 A1 | 5/2019 | Phillips et al. | |
| 2019/0276043 A1* | 9/2019 | Uchida | B62D 1/265 |
| 2020/0062259 A1* | 2/2020 | Huh | B60W 30/18072 |
| 2020/0249684 A1 | 8/2020 | Onofrio et al. | |
| 2020/0339109 A1 | 10/2020 | Hong et al. | |
| 2021/0255984 A1 | 8/2021 | Khatri | |
| 2022/0009522 A1 | 1/2022 | Zhang et al. | |
| 2022/0048566 A1 | 2/2022 | Prasad Challa et al. | |
| 2022/0135030 A1* | 5/2022 | Varunjikar | B60W 30/10 |
| | | | 701/1 |
| 2022/0176960 A1 | 6/2022 | Awathe et al. | |
| 2022/0363250 A1 | 11/2022 | Varunjikar et al. | |
| 2023/0008230 A1 | 1/2023 | Cordeiro et al. | |
| 2023/0270515 A1* | 8/2023 | Tanabe | A61B 90/50 |
| | | | 606/1 |
| 2023/0415734 A1* | 12/2023 | Zhu | G01S 13/867 |
| 2024/0253622 A1* | 8/2024 | Awathe | B60W 30/12 |

* cited by examiner

VEHICULAR CONTROL SYSTEM WITH ENHANCED LANE CENTERING

CROSS REFERENCE TO RELATED APPLICATION

The present application claims the filing benefits of U.S. provisional application Ser. No. 63/263,177, filed Oct. 28, 2021, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties.

SUMMARY OF THE INVENTION

A method for enhancing a vehicular driving assistance system includes obtaining in-vehicle test data representative of performance of the vehicular driving assistance system of a vehicle during operation of the vehicular driving assistance system and determining, using the in-vehicle test data, a second order transfer function that models operation of the vehicular driving assistance system. The second order transfer function matches a magnitude response of the in-vehicle test data. The method includes providing a simulation environment. The simulation environment simulates the vehicular driving assistance system using the second order transfer function. The method includes determining, using the simulation environment, a feedforward contribution and a feedback contribution of the vehicular driving assistance system, and enhancing the vehicular driving assistance system based on adjustment of the feedforward contribution and the feedback contribution of the vehicular driving assistance system.

These and other objects, advantages, purposes and features of the present invention will become apparent upon review of the following specification in conjunction with the drawings.

DESCRIPTION OF THE PREFERRED EMBODIMENTS

A vehicle vision system and/or driver or driving assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
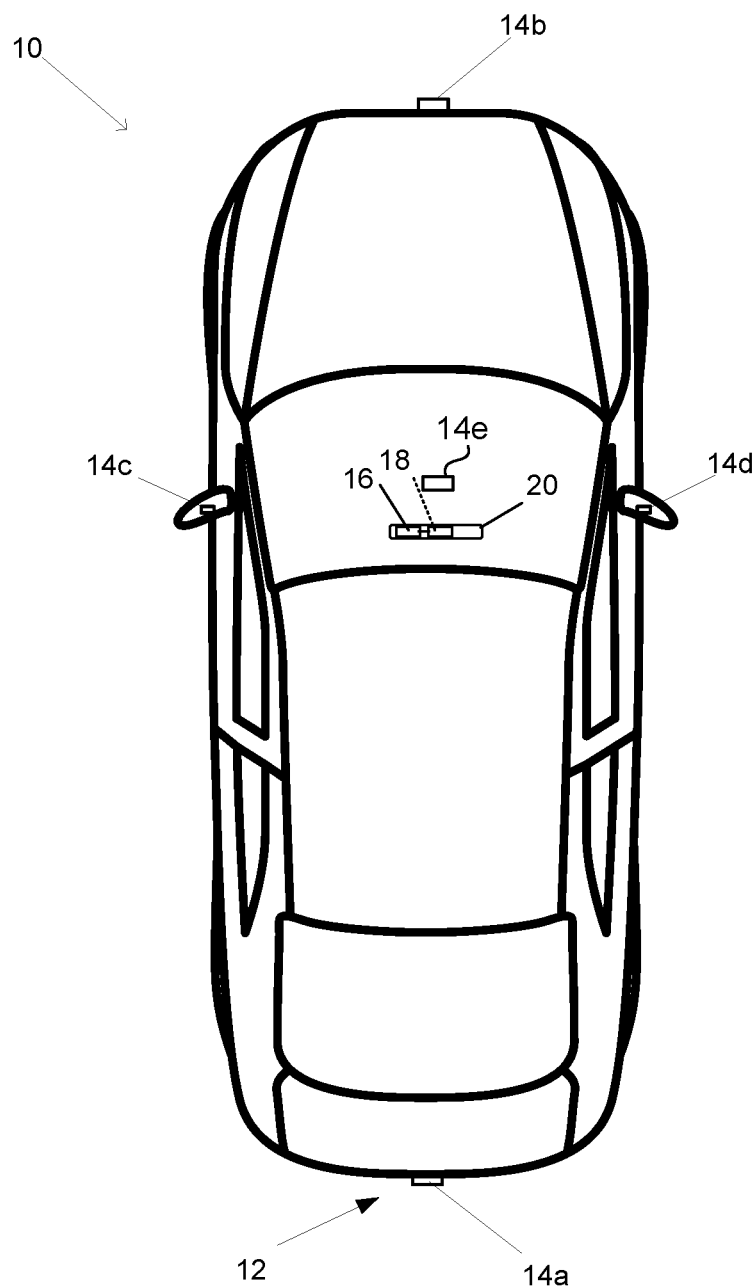
FIG. 1 is a plan view of a vehicle with a vision system that incorporates cameras.

Referring now to the drawings and the illustrative embodiments depicted therein, a vehicle 10 includes an imaging system or vision system 12 that includes at least one exterior viewing imaging sensor or camera, such as a rearward viewing imaging sensor or camera 14a (and the system may optionally include multiple exterior viewing imaging sensors or cameras, such as a forward viewing camera 14b at the front (or at the windshield) of the vehicle, and a sideward/rearward viewing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera 14e may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) 18 having electronic circuitry and associated software, with the electronic circuitry including a data processor or image processor that is operable to process image data captured by the camera or cameras, whereby the ECU may detect or determine presence of objects or the like and/or the system provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

The automotive industry is continuously innovating technologies to make current and future vehicles more comfortable and safer to drive. The automated driving assistance system (ADAS) technology is at the forefront to make this happen. A number of today's new motor vehicles have technology that help drivers, for example, avoid drifting into adjacent lanes or making unsafe lane changes, warn drivers of other vehicles behind them when they are backing up, brake automatically when a vehicle ahead of them stops or slows suddenly, etc. These and other safety technologies use a combination of hardware (sensors such as cameras, radar, lidar, etc.) and software to help vehicles identify certain safety risks so they can warn the driver to act or autonomously/semi-autonomously control the vehicle in order avoid a crash. These safety features enhance safety of the equipped vehicles and other vehicles sharing the road. In addition, there are several common features that make daily driving more comfortable and reduce driver fatigue. These comfort features include adaptive cruise control (ACC), lane keeping assist, lane centering assist, automated lane change, traffic jam assist, etc.

Figure 2:
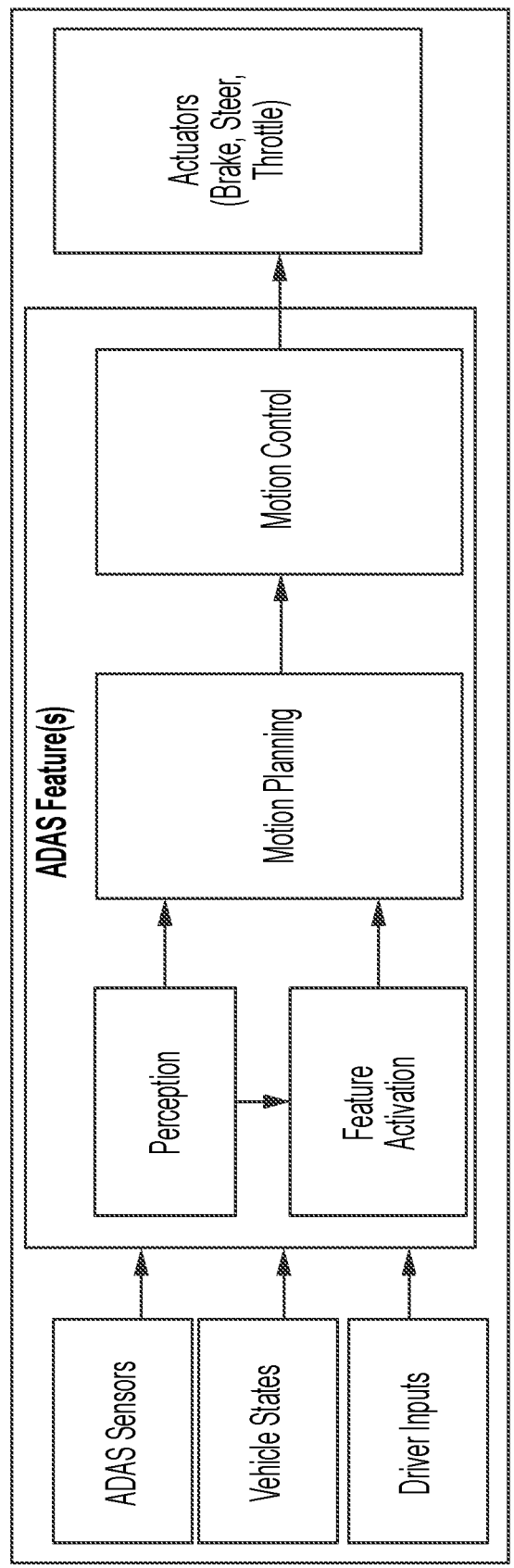
FIG. 2 is a block diagram of an advanced driver assistance system (ADAS)

FIG. 2 illustrates an exemplary architecture for design of many of these ADAS features. Depending upon the feature(s) being implemented, one or more ADAS sensors are deployed at the vehicle. Some examples include, a front looking camera module (FCM), a front long-range radar, corner radars, a lidar sensor, etc. In addition, vehicle states (e.g., yaw rate, vehicle speed, etc.) and driver inputs (e.g., user inputs such as steering/braking/throttle inputs, and the like) are used by the ADAS feature(s). Information from ADAS sensors is used by a perception module to provide necessary environmental information (e.g., lane markings, object lists, etc.) to a motion planning module. A motion planning module plans longitudinal and/or lateral motion of the vehicle. The motion control module generates the necessary actuation commands to control the vehicle motion. For example, an AEB feature would plan to decelerate the equipped vehicle upon detection of an impending vehicle collision by determining and applying the necessary braking commands.

For lateral control ADAS features (e.g., lane centering), the motion control module generates either a steering torque or angle command for the steering actuation. However, the steering system may have its own dynamic response due to closed-loop torque control inside electric power steering (EPS) for driver assistance as well as its own multi-body dynamics. Hence, this is a critical system to consider when designing or tuning closed-loop ADAS control features. However, during early development, these feature algorithms often assume ideal environmental and vehicle conditions while doing performance evaluation.

Implementations herein consider end-to-end ADAS features, i.e., features from a camera sensor output to steering actuation controlling the vehicle. For example, lane centering control systems often have multiple control loops within the vehicle system. The delay in steering system response has a significant effect on overall lane centering performance and driver feel. This disclosure focuses on improving dynamics of electronic power steering (EPS) behavior and overall ADAS feature performance (e.g., lane centering performance) using system identification techniques to understand EPS dynamics as well as vehicle lateral dynamics. More specifically, implementations herein focus on the effects of EPS angle tracking performance on overall ADAS performance, although the disclosure may be applied to many other ADAS features in a similar manner.

Figure 3:
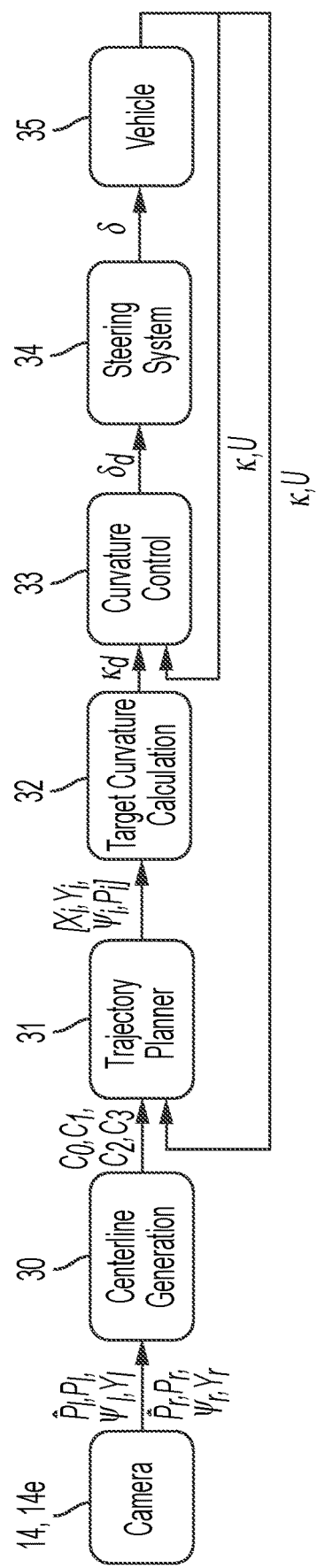
FIG. 3 is a block diagram of a lane centering control architecture.

Lane Centering is an ADAS comfort feature. The system generally uses lane marking information captured by a front-looking camera to generate a steering command to help center the vehicle within the lane the vehicle is traveling along. This feature helps reduce driver fatigue by making driving more comfortable. FIG. 3 illustrates a block diagram of a vehicular control system (e.g., a lane centering feature) for a vehicle 10. The system includes a camera 14 (such as the forward viewing camera 14e). Front camera modules are very common in today's passenger vehicles to support various ADAS features. The camera 14 is usually mounted on the front windshield and captures images of the front view from the vehicle 10. Such modules output a wide array of useful information including the lane marking information. Specifically, the camera may determine/generate and output lane-mark position (y), heading ($\psi$), curvature ($\rho$), curvature derivative ($\dot{\rho}$), and quality for both left and right lane marks.

A centerline generation module 30 uses this information from the camera 14 (or other image sensor) to express a centerline of the traffic lane the vehicle 10 is traveling along as a polynomial equation of the third order:

$$y_c(x) = c_3 x^3 + c_2 x^2 + c_1 x + c_0 \tag{1}$$

Here, $y_c(x)$ indicates lateral position of a centerline point at longitudinal distance x in the equipped vehicle's local coordinate system. Generally, the quality or confidence of each lane mark received from the camera does not match all the time. For example, the lane mark on the left side of the traffic lane is poorly visible and lane processing must be performed to manage this while the lane mark on the right side of the traffic lane is clearly visible. Also, the detected length or range of each lane mark may differ and may not be sufficient at a given vehicle speed.

Figure 4:
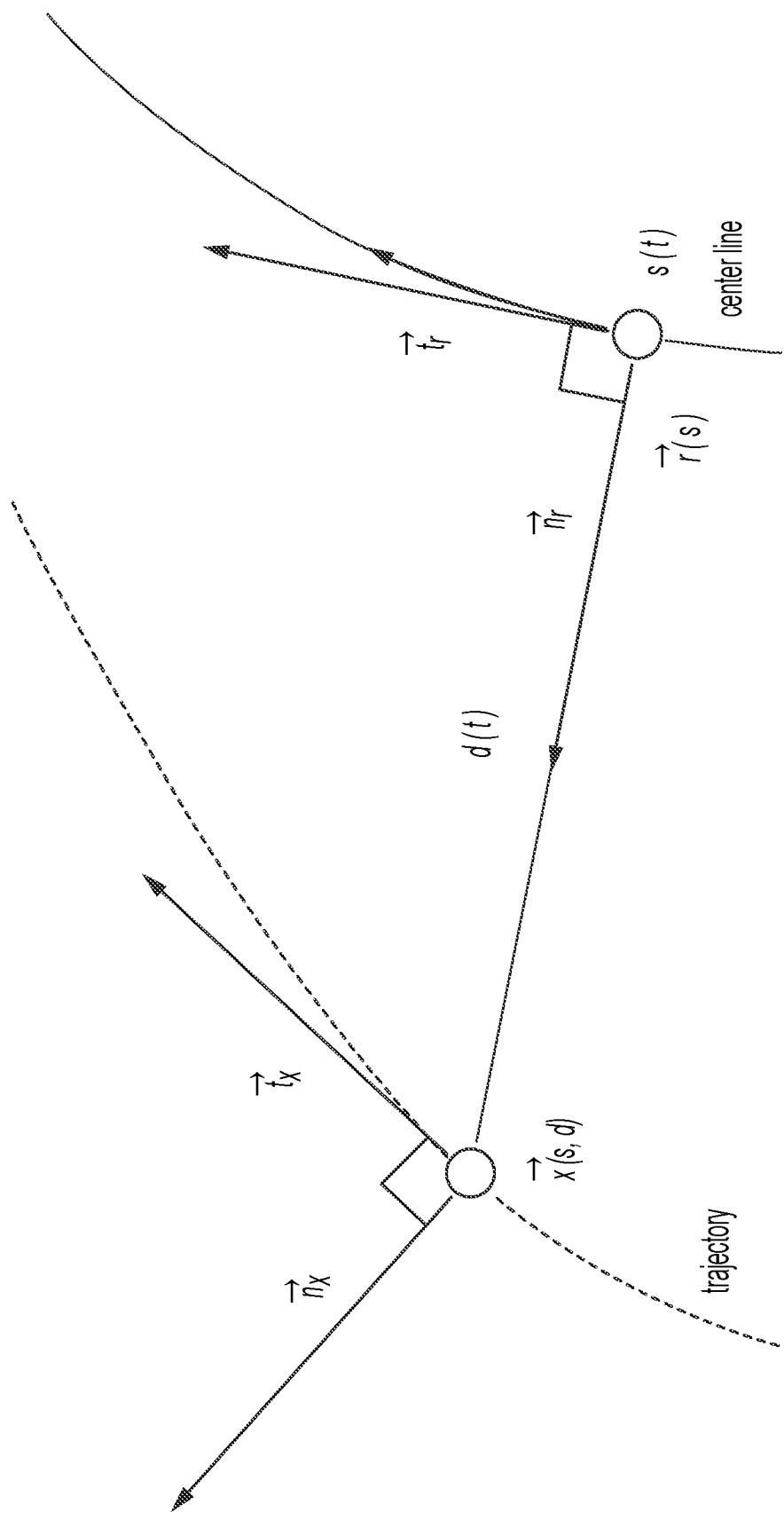
FIG. 4 is a schematic view of trajectory generating in Frenet coordinates.

A trajectory planner block 31 produces a dynamic, desired curvature ($\kappa_d$) value for the vehicle to follow. The centerline of the current traffic lane is fixed in a global coordinate system (i.e., not relative to the vehicle). However, the vehicle needs to plan a trajectory in its local coordinate system (i.e., relative to the vehicle) every time. Such a trajectory, when perfectly followed, takes the host vehicle to the centerline of the traffic lane. Furthermore, it is also important to reach the centerline with correct heading and curvature in order to stay on the course of that centerline path and give smooth lane-centering performance for the occupants of the vehicle. There are various ways to generate such a trajectory y=y(x). The current vehicle motion state (i.e., position, heading, and/or curvature) and expected motion state at a target point on centerline of the traffic lane usually serve as boundary conditions that may be used to formulate a trajectory generation problem. The systems and method described herein consider a quintic polynomial-based trajectory generation in Frenet coordinates (i.e., the Frenet-Serret coordinate system). The Frenet coordinate system may be used to describe motion of an object with respect to a path. The system generates and describes the trajectory in Frenet coordinates (s, d). The notation s denotes the distance traveled along the centerline and the notation d denotes perpendicular offset from the path or centerline (FIG. 4). The system may then convert the trajectory (in Frenet coordinates) to the vehicle's local Cartesian coordinates when sending output from the trajectory planner block.

The system generates a trajectory for a horizon time of $T_H$ at each sample time. The system may assume that the vehicle speed is constant. To get coefficients of such polynomial, boundary conditions may be established. The boundary conditions may include:

$$d(0)=d_v(0) \tag{2}$$

$$\dot{d}(0)=\dot{d}_v(0) \tag{3}$$

$$\ddot{d}(0)=\ddot{d}_v(0) \tag{4}$$

$$d(T_H)=d_c(T_H) \tag{5}$$

$$\dot{d}(T_H)=\dot{d}_c(T_H) \tag{6}$$

$$\ddot{d}(T_H)=\ddot{d}_c(T_H) \tag{7}$$

Once a trajectory is obtained to maneuver the vehicle from the current vehicle position to a target position at horizon time $T_H$, the system then obtains a desired vehicle curvature or target curvature. This may be accomplished by setting a look-ahead time, $T_{LH}$ (<$T_H$), and picking the trajectory's curvature value at that point. Due to overall system dynamics, there is generally some system delay between desired curvature, $\kappa_d$, and actual host vehicle curvature ($\kappa$) achieved. Hence, a look-ahead time close to this delay time is chosen to help with compensation. Notably, an alternative option includes using the lateral position error and the heading error along the trajectory to calculate a curvature command. However, the planning is already being performed iteratively and is reacting to lateral and heading errors with respect to the centerline path, thus setting the look-ahead time may be advantageous.

A curvature control module 33 uses the vehicle wheelbase and understeer gradient value ($\kappa_{US}$) to convert the desired curvature, $\kappa_d$, to a steer angle command, $\delta_d$, at given vehicle speed U.

$$\delta_d=(L+\kappa_{US}\cdot U^2)\kappa_d \tag{8}$$

As discussed in more detail below, variation analysis considers a feedback term for curvature control in addition to the feedforward term discussed above. The feedback term consists of proportional-integral-derivative (PID) control applied to the curvature error between desired and host curvature.

The steering system 34 (e.g., the EPS system) generally accepts input as either an angle or a torque value to control steering the vehicle (i.e., lateral control of the vehicle). In this example, the steer angle command obtained from curvature control module 33 is used internally by the EPS system 34 to get to the equivalent steer angle $\delta$. The steering system here represents both steering control and plant (i.e., a model with the simplest possible dynamic system). The EPS system outputs a steering angle (e.g., a tire angle controlled by a steering rack). The vehicle's lateral motion is ultimately controlled by this angle. Once the vehicle sets in motion, the vehicle yaw rate starts changing. The vehicle yaw rate and vehicle speed are used to get a host vehicle curvature given by the ratio of yaw rate and longitudinal velocity (=YawRate/U). The dynamics of the vehicle are represented by the vehicle block 35.

Lane centering assist systems typically use three control loops. At the innermost loop, the EPS steering control system provides the desired steering angle using an angle or torque feedback. The next outer loop consists of the curvature control system, which produces the desired steering angle command using feedforward and feedback terms. The outermost loop includes trajectory planner which produces the desired curvature command to the curvature control system.

From a design perspective, the response times or control bandwidths of the three control loops are interdependent. As the system progresses from the inner loop to the outer loops, the response time must be slowed down. For further insight, an example is considered with two control loops of FIG. 5. Here, the plant is an integrator (1/s), which is the simplest possible dynamic system. The inner loop has a bandwidth of $\omega_1$ and the outer loop has a bandwidth of $\omega_2$. Thus, the transfer functions of the two control loops may be represented as:

$$\frac{x(s)}{z(s)} = \frac{\omega_1}{(s+\omega_1)} \tag{9}$$

$$\frac{x(s)}{r(s)} = \frac{\omega_2 \frac{\omega_1}{(s+\omega_1)}}{1+\omega_2\frac{\omega_1}{(s+\omega_1)}} = \frac{\omega_1\omega_2}{(s^2+\omega_1 s+\omega_1\omega_2)} \tag{10}$$

The damping factor ($\zeta$) of the outer loop (which is a second order system) is given by the following:

$$\zeta = \frac{1}{2}\frac{\omega_1}{\sqrt{\omega_1\omega_2}} = \frac{1}{2}\sqrt{\frac{\omega_1}{\omega_2}} \tag{11}$$

Hence, in order to have a well damped response ($\zeta=1$), the system requires:

$$\omega_2 = \frac{1}{4}\omega_1 \tag{12}$$

When the inner loop and outer loop bandwidths are the same, the damping factor is:

$$\zeta = \frac{1}{2} \tag{13}$$

Figure 6:
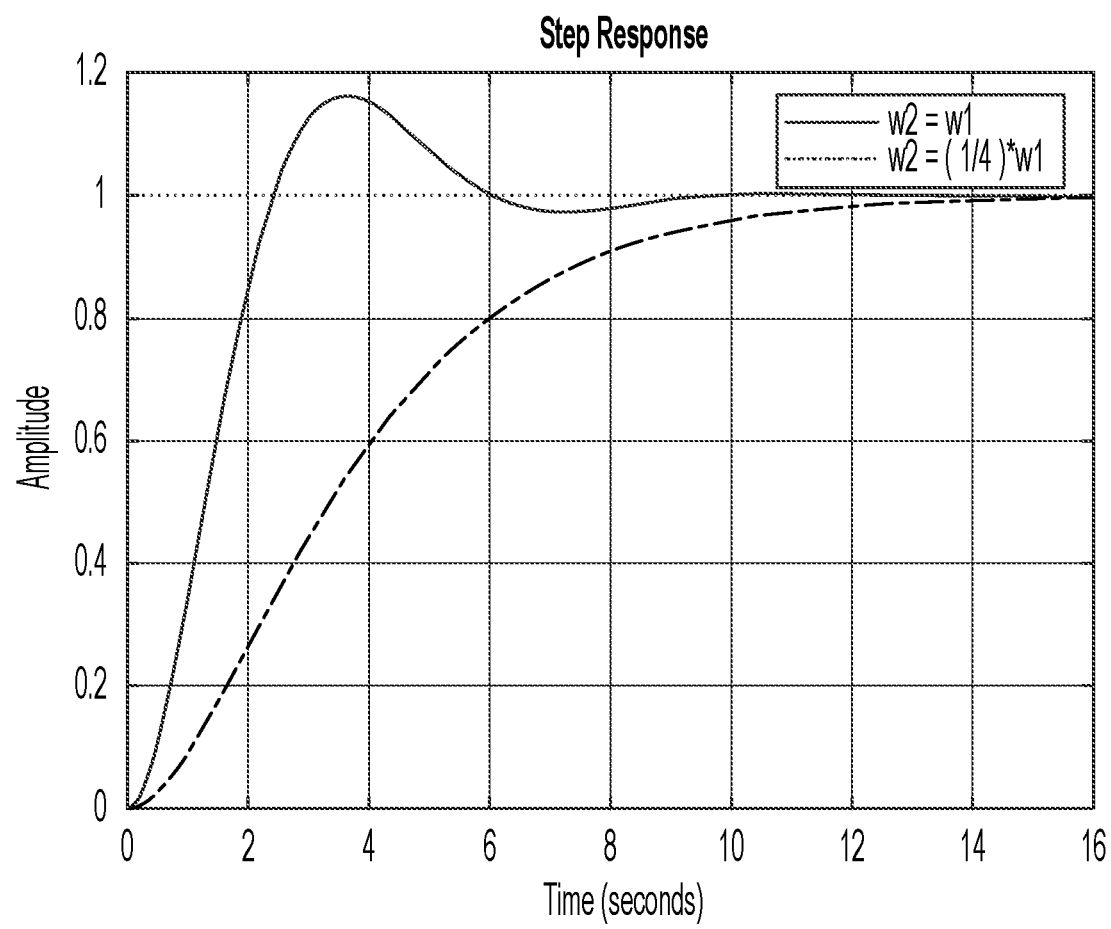
FIG. 6 is a plot of time responses for closed loop systems.

This provides an underdamped oscillatory response (FIG. 6) which is not desirable. FIG. 6 illustrates time responses for a closed loop system with $\omega_2=\omega_1$ and $$\omega_2 = \left(\frac{1}{4}\right)\omega_1.$$

Thus, the curvature control system must be slower than the EPS steering control system, and the trajectory planner must be slower than the curvature control system. Accordingly, the design challenge for system designers is to (a) keep the inner loop as fast as possible without crossing the steering actuator limits, (b) keep sufficient separation of bandwidth across the control loops, and simultaneously, (c) not excessively slow down the outer most loop which can cause undesirable delay in the lane centering response.

Figure 5:
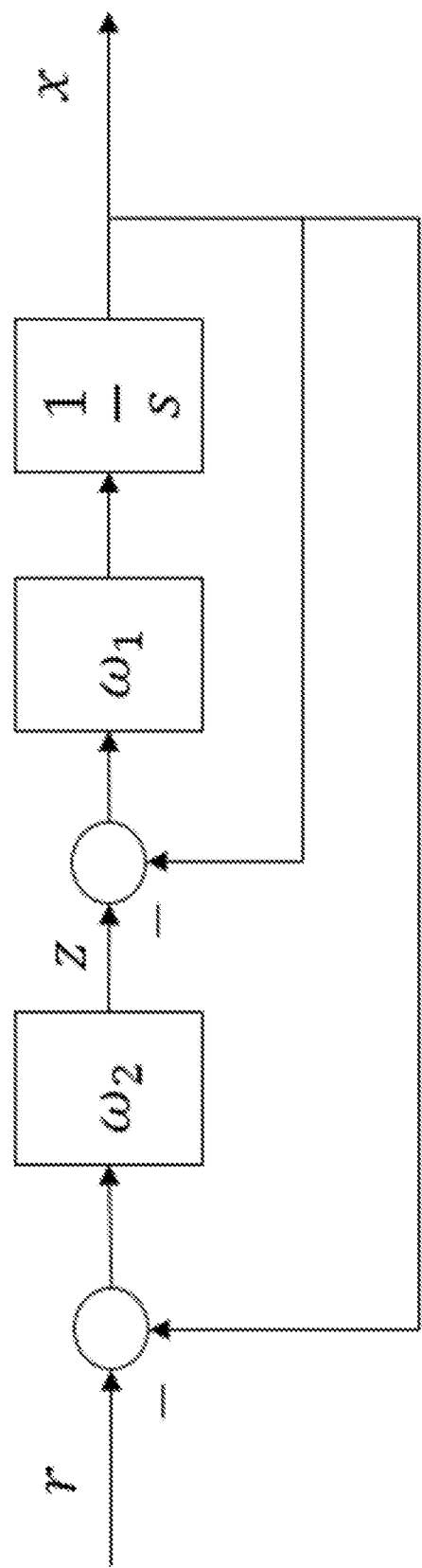
FIG. 5 is a schematic view of exemplary control loops.
Figure 7:
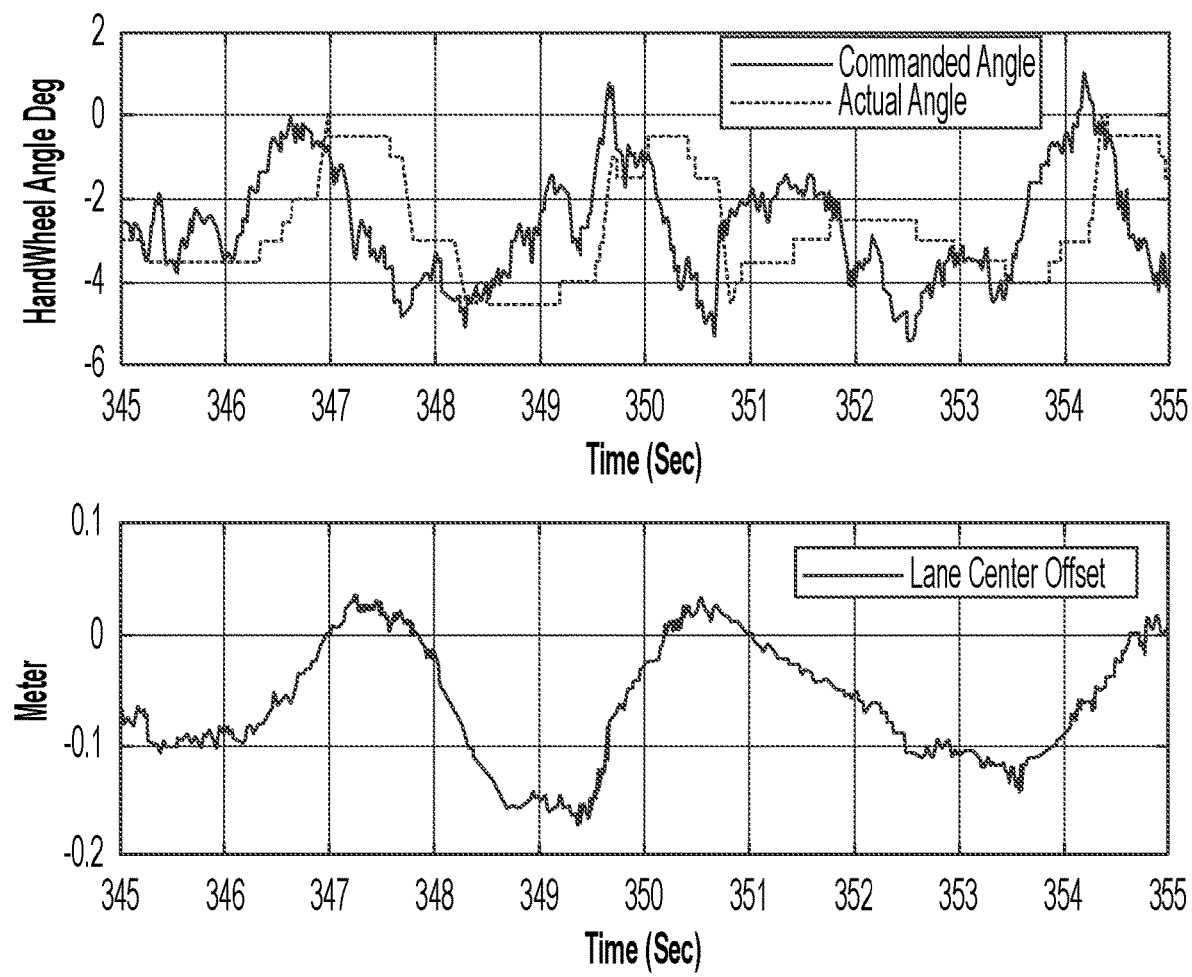
FIG. 7 are plots of vehicle data showing angle tracking during lane centering.

FIG. 7 illustrates exemplary test data collected using a test vehicle equipped with a front camera on urban road with a straight section where the vehicle velocity was 50 miles per hour and a lane centering feature was active. It can be observed that the steering angle tracking was not perfect (i.e., the commanded steering angle and actual steering angle differ in both magnitude and phase). Because in this example the whole system is in closed loop involving the lane centering trajectory planning and controls, the resulting effect can be seen in the vehicle position. FIG. 5 also includes the offset from lane center (detected by the front camera) and it can be seen that the vehicle has a low frequency oscillation of around 0.2 Hz with a lane center offset amplitude of around 0.2 m.

This low frequency oscillation in both the steering wheel and vehicle position can be felt by the occupants of the vehicle and it is not optimal for a comfort feature such as lane centering. One of the reasons for this phenomenon is the delay present in steering angle tracking. Improvement in tracking may improve the overall performance of the feature. It should be noted that such delay or non-ideal tracking can happen in physical systems due to system friction, inertia, communication loop delays, etc.

The steering angle tracking performance as well as the vehicle's lane center tracking performance may be improved by manually tuning control parameters in the vehicle and iteratively checking the performance. However, this is highly inefficient and implementations herein first identify the dynamics of the EPS system to allow theoretical tuning prior to any iterative tuning in the vehicle.

To this end, a representative speed (e.g., based on system identification experiments conducted at various vehicle speeds) is considered to show the frequency-domain system response and model response. The time-response of the derived model may be verified via collected steering angle data. The derived model may be used to re-tune angle-tracking control parameters and lane-centering response.

In order to improve the steering angle tracking, first the system identification of the EPS system of the vehicle is accomplished to obtain a physics-based or mathematical (transfer-function) model for its representation. This model can help define and explain the system and be used for tuning the control calibrations. It can significantly reduce the testing/tuning activities through simulation.

Figure 8:
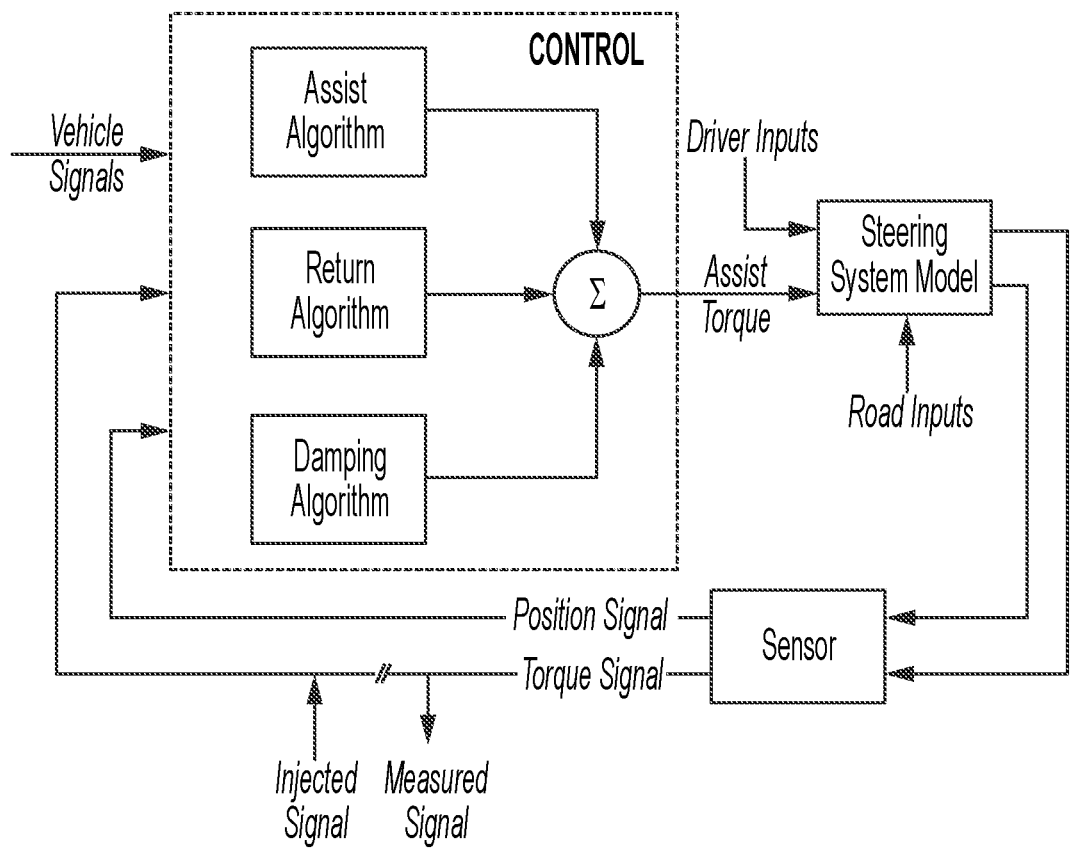
FIG. 8 is a schematic view of an electric power steering (EPS) system in a closed loop.
Figure 9:
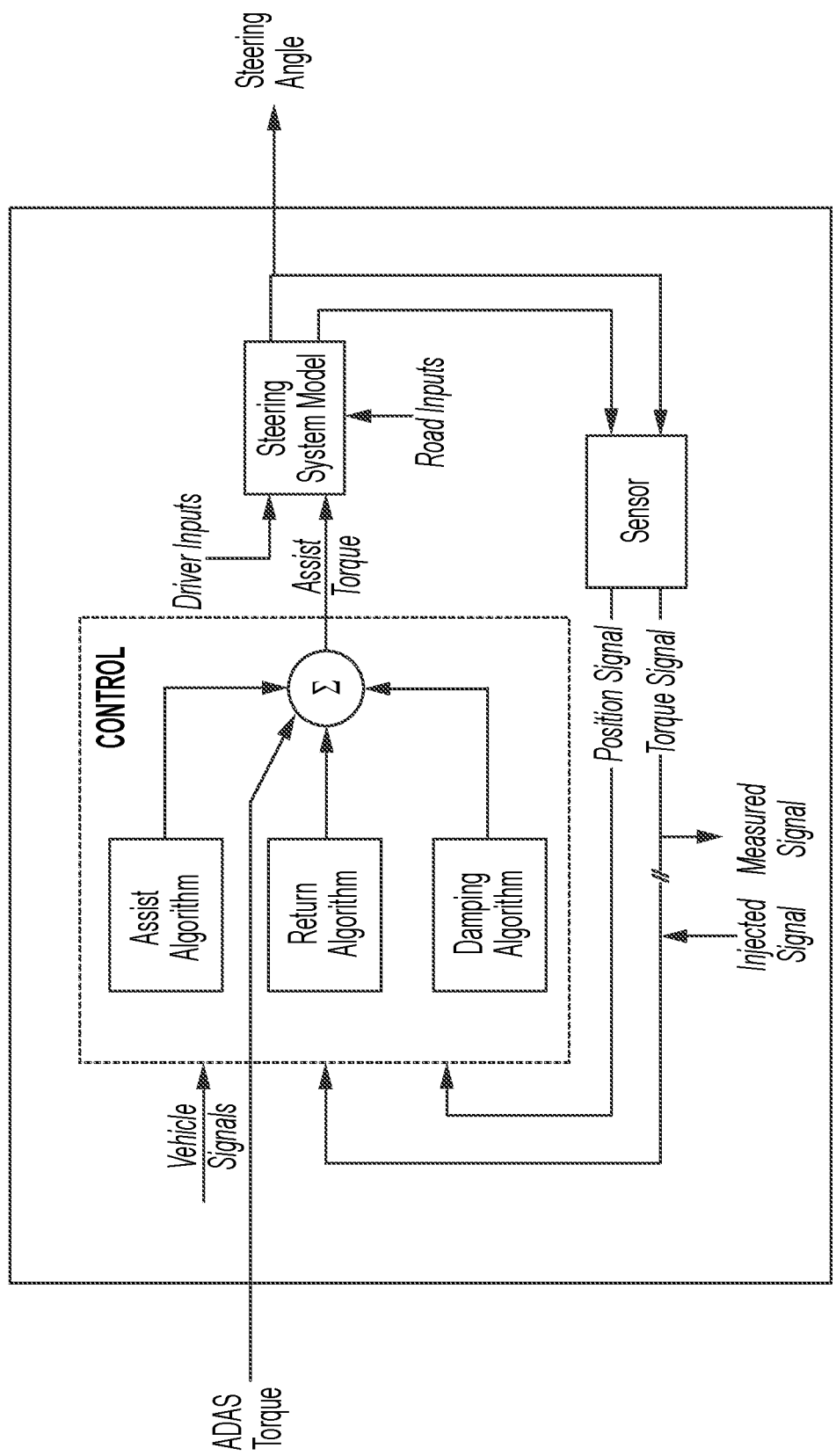
FIG. 9 is a schematic view of an ADAS and an EPS system in a closed loop.

FIG. 8 illustrates the closed-loop dynamics of an example EPS system of a vehicle. Assist, return, and damping algorithms internal to the EPS system help the driver of the vehicle steer the vehicle by providing an assist torque via an EPS motor. The ADAS features (e.g., lane-centering) generate an ADAS torque to help keep the vehicle in the center of a lane. This ADAS torque is usually added to the summation block illustrated in FIG. 9. Because ADAS torque may be generated in parallel with other EPS functions, from the perspective of the ADAS features, ADAS torque is an input to the EPS system and steer angle (or tire angle) is an output. System identification begins with collecting the test data in region of interest. It is well-known that EPS systems provide different assist levels at different vehicle speeds. This means the system dynamics change with different vehicle speeds. Here, test data was collected at different vehicle speeds such as 10, 20, 40, 60, 80, and 100 kph. Various ADAS torque inputs such as varying sinusoid (chirp), step command, etc. may be considered. The frequency range for chirps may be between 0.1 to 10 Hz.

The test data may be collected in the time-domain and be used to create Bode plots for magnitude and phase at different velocities. Although both controls and multi-body physical system (e.g., EPS) is involved in this scenario, a simple second order transfer function below may be used for model matching.

$$G(s) = \frac{1}{ps^2 + qs + r} \quad (14)$$

Equation (14) is a representation of the second order system, where p, q, and r are the control parameters defining the system. Using the same test inputs, the next step is to determine the values of parameters such that the test output matches with the simulation output.

In some examples, the vehicle data reveals a non-zero steering angle for straight road driving. This may be attributed to tire adjustment and/or suspension effects. To calculate the steering bias, the vehicle may be driven on a straight section of road with no banking and with the driver's hand on and off the steering wheel. This allows for checking the steering angle value required to make the vehicle go straight during a hand-on portion and to find the settling value of steering angle during a hand off portion on a straight road.

Figure 10:
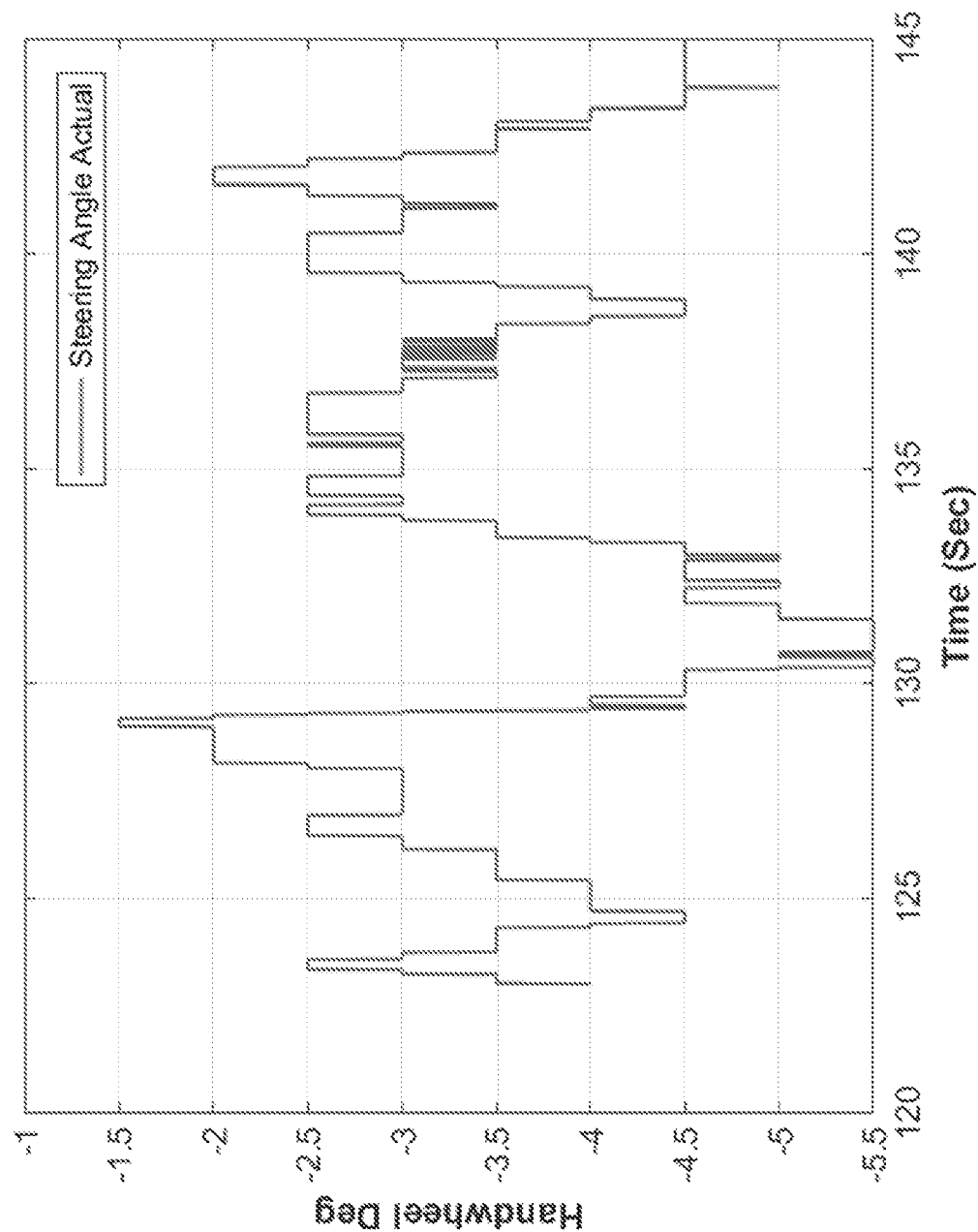
FIG. 10 is a plot of steering angle commands during an exemplary test run.

Ideally, when the road section has no banking, the lateral acceleration and yaw rate should be zero, and the steering angle value needed for the vehicle to go straight is the steering bias. The test data may include multiple runs on a straight section of road (i.e., FIG. 10) to collect steering angle data. An average may be determined from the repeated tests to calculate the steering bias (e.g., −3.5 degrees in the example of FIG. 10).

Figure 11:
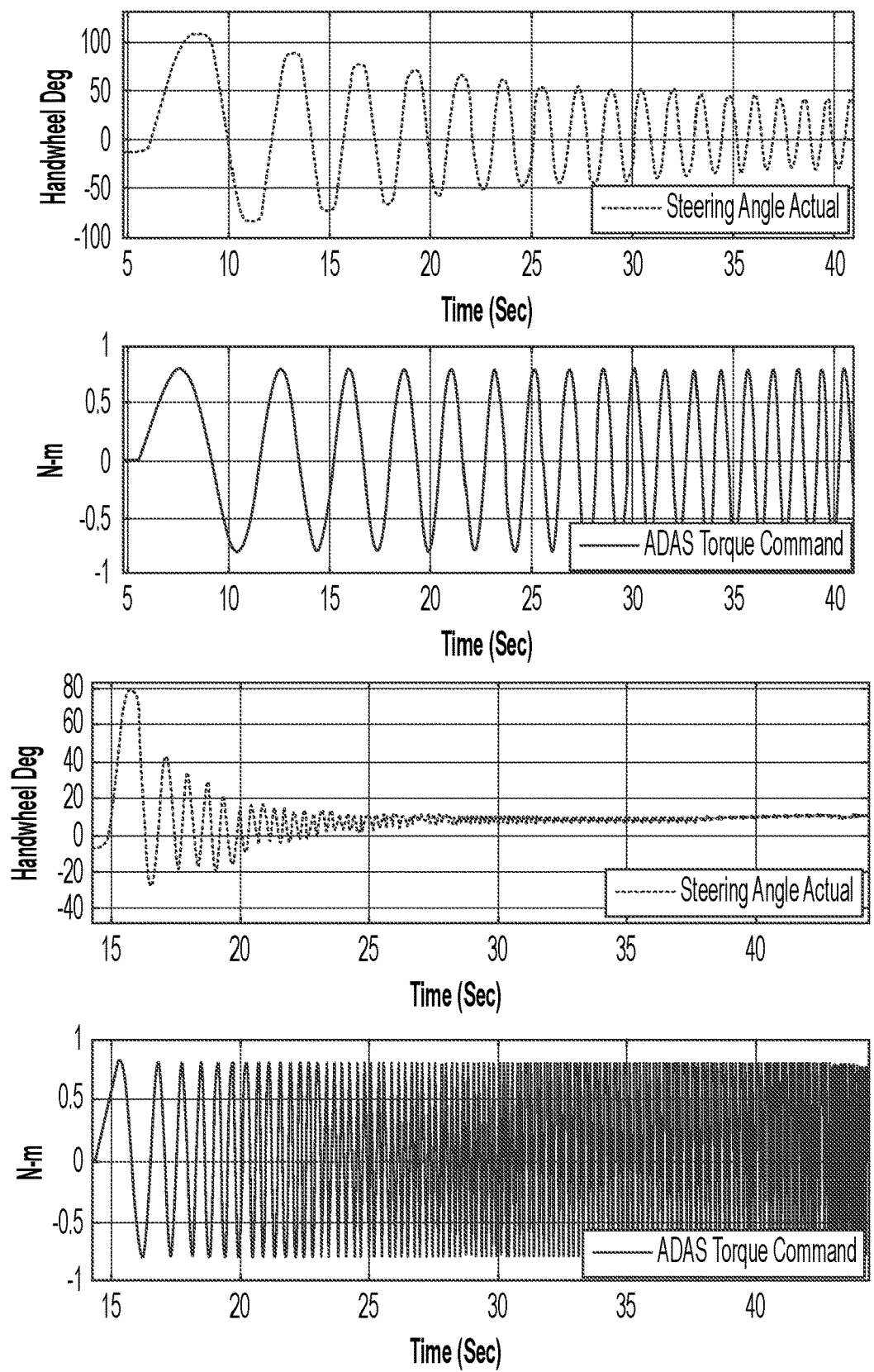
FIG. 11 are plots of input commands and corresponding output data for ADAS torque commands.

The test data may be collected where the input was an ADAS torque chirp signal (i.e., sinusoidal signal with fixed amplitude and varying frequency over a time period). This allows data collection at all possible frequency ranges over which the system operates. Driver inputs to the EPS system are typically low frequency (i.e., below 1 to 2 Hz). In this example, a 0.1-10 Hz varying frequency sinusoid was used. Considering the test track length, data for a particular velocity may be taken in two steps with frequency range as 0.1 to 1 Hz and from 1 Hz to 10 Hz. Afterward, the combined time domain data may be used to generate Bode plots. When generating Bode plots for a particular speed, the data may be combined at lower and higher frequencies and the plots may be generated for a frequency range of 0.1 to 10 Hz. FIG. 11 illustrates exemplary test track data where the input was ADAS torque chirp at high and low frequencies. The response of the system is visible in the plots. This data may be used to generate the Bode plots for the system where the input is ADAS Torque and the output is the steering angle. In this example, the plots are for a 50 mph case.

Figure 12:
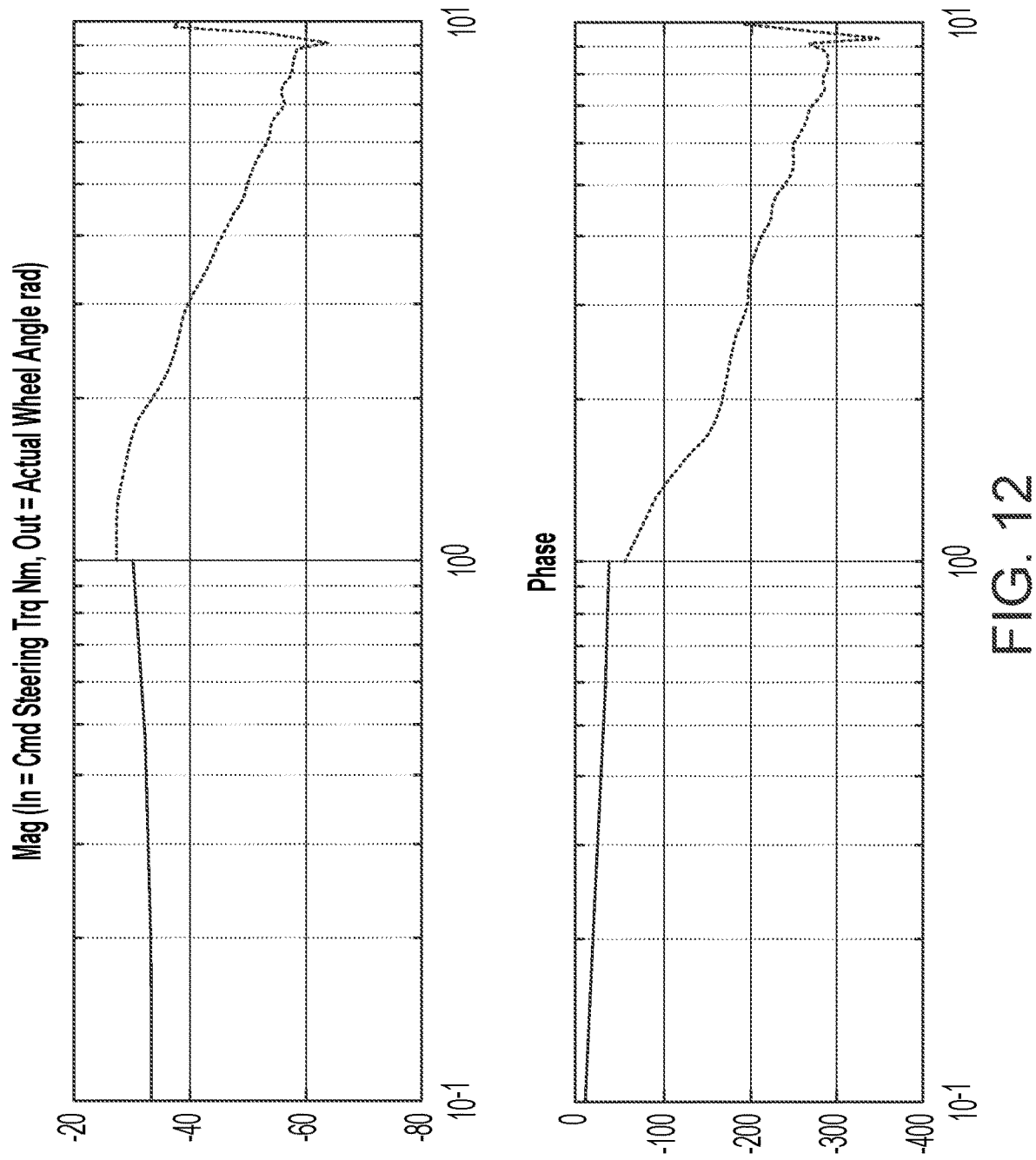
FIG. 12 are Bode plots of a vehicle for ADAS torque versus angle.

FIG. 12 illustrates an exemplary frequency response of the transfer function from ADAS torque to steering angle. It is noticeable in the Bode plot that at 1 Hz there is a discontinuity and sudden jumps can be seen at approximately 10 Hz. This is a result of taking the data at two steps 0.1-1 Hz and 1-10 Hz and combined it for Bode plot generation. That is, insufficient data points at higher frequency causes the jumps.

Generating the Bode plots results in the frequency response in addition to time-domain data. The next step involves identifying the parameters (i.e., p, q, and r of Equation (14)) of the second order system such that the model/plant response matches the test data either in frequency domain or time domain. In some implementations, an optimization script is used. For example, MATLAB may be used to perform the optimization routine. Some methods may not need an analytical derivative of the cost function while still being robust to noisy data.

The optimization routine or algorithm optimizes an objective function. The objective function may be thought of as a cost function and should be formulated according to the problem to be solved. For example, in some scenarios, the objective function is formulated to output the error between the actual data and the model using the optimized parameters.

$$\text{Objective Function} = \Sigma_{f=0.1}^{f=10} w1_f \times \|(\text{Magnitude}_{data} - \text{Magnitude}_{model})\| + w2_f \times \|(\text{Phase}_{data} - \text{Phase}_{model})\| \quad (15)$$

Figure 13:
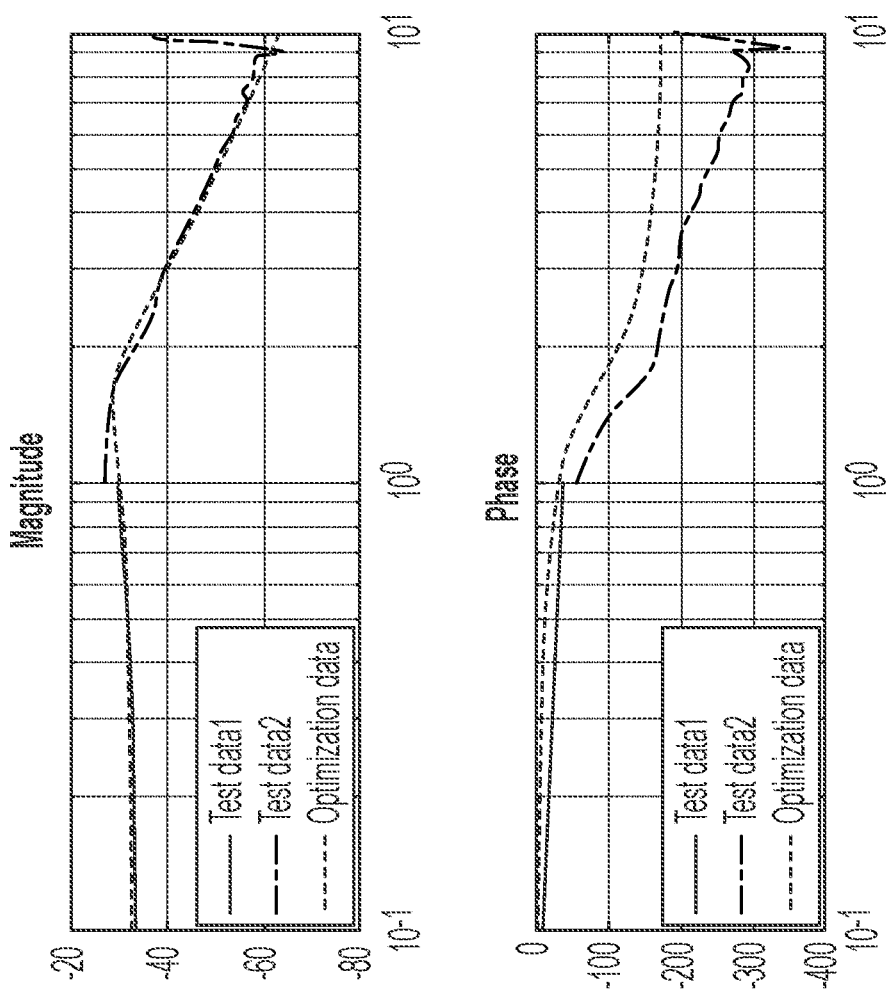
FIG. 13 are Bode plots of frequency domain matching for parameter identification.
Figure 14:
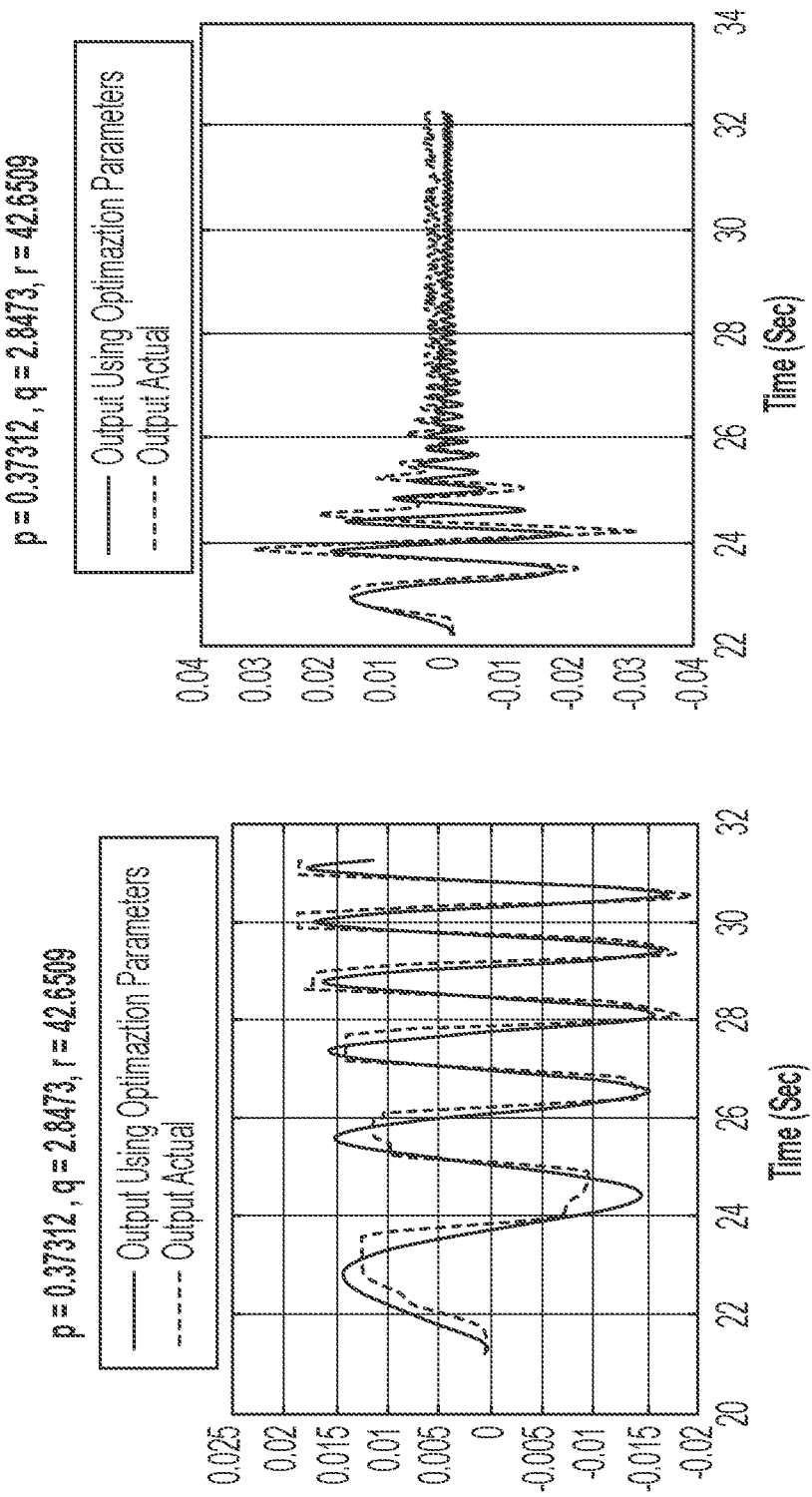
FIG. 14 are plots of time domain matching for parameter identification.

The aim for optimization is to minimize the objective function output. The objective function is formulated such that the different weights can be ordered at different sections when doing the frequency domain optimization. Optionally, magnitude error is weighted more than phase error. Optionally, the operable range of 0.1-2 Hz is weighted more vs lower and higher frequencies. FIG. 13 illustrates exemplary results after performing optimization. In this example, the phase match is not as accurate as the magnitude match. This may be because a second order transfer function can only provide phase reduction up to −180 degrees. FIG. 14 illustrates the result time domain matching with the identified parameters.

After performing optimization to obtain optimal values of p, q, and r, the identified parameters may then be used to check the output when the same ADAS Torque input from test data was used. Referring still to FIG. 14, it can be noted that, in the time-domain, there is some DC offset at high frequency inputs, likely because of steering friction. In this example, (when velocity equals 50 mph), the optimization results in a p=0.37312, q=2.8473, and r=42.6509.

Figure 15:
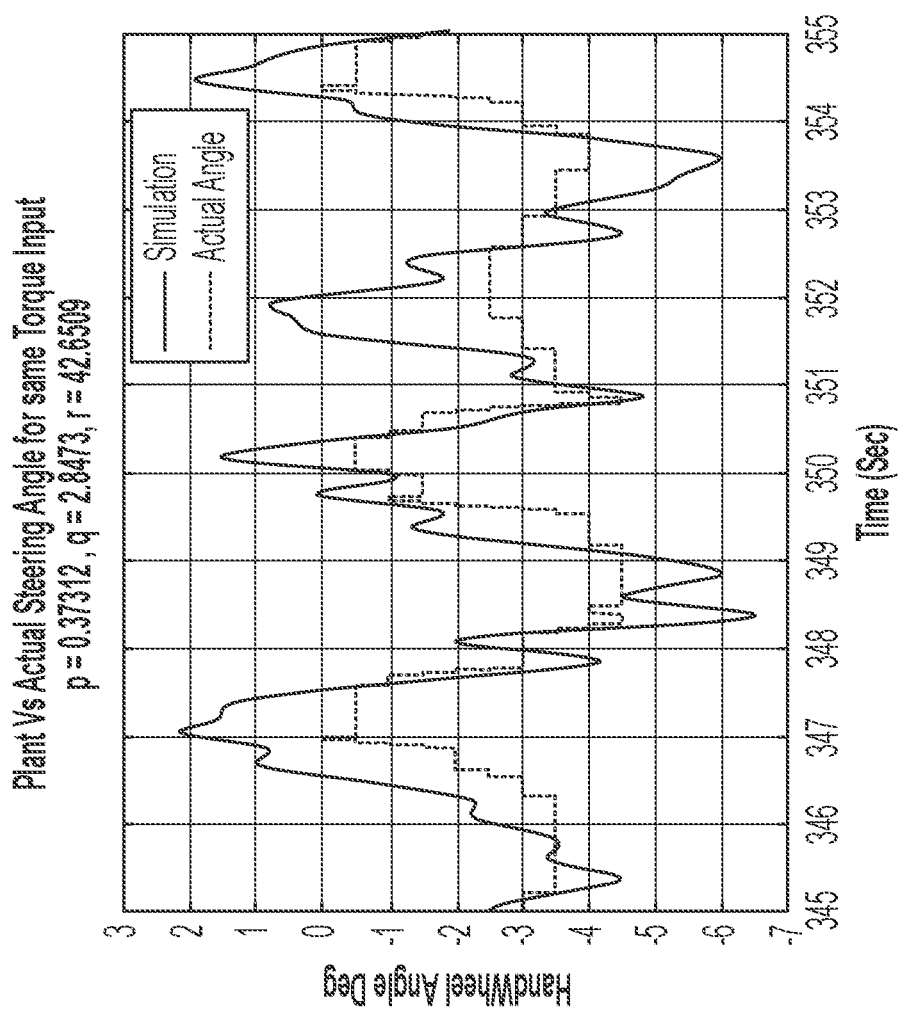
FIG. 15 is a plot of plant versus actual steering angle comparison.

Referring back to FIG. 7, an issue with base tuning of lane centering feature is the presence of low frequency steering oscillation of approximately 0.2 Hz. Accordingly, the same is also observed in the vehicle's lateral motion. This is because the lane centering feature works in a closed loop with trajectory planning as the outer loop and steering tracking as the inner loop. In FIG. 7, the steering tracking is not optimal. FIG. 15 illustrates the output from the derived plant using the identified parameters from the example of FIG. 14 using the same ADAS Torque of FIG. 7 as an input. That is, FIG. 15 illustrates a plant versus actual steering angle comparison. FIG. 15 demonstrates that the simulation results do not match with the actual test result, which implies that the system identification does not accurately represent the dynamics here. One of the main reasons for this could be the fact that the system identification was done where steering angle output was high (e.g., up to 100 degrees). However, the typical lane centering commands are low. The steering plant dynamics can change with angle magnitude itself as assist tables/function inside EPS (FIG. 8). Additionally, system friction and CAN bus signal resolution can further affect this phenomenon.

Figure 16:
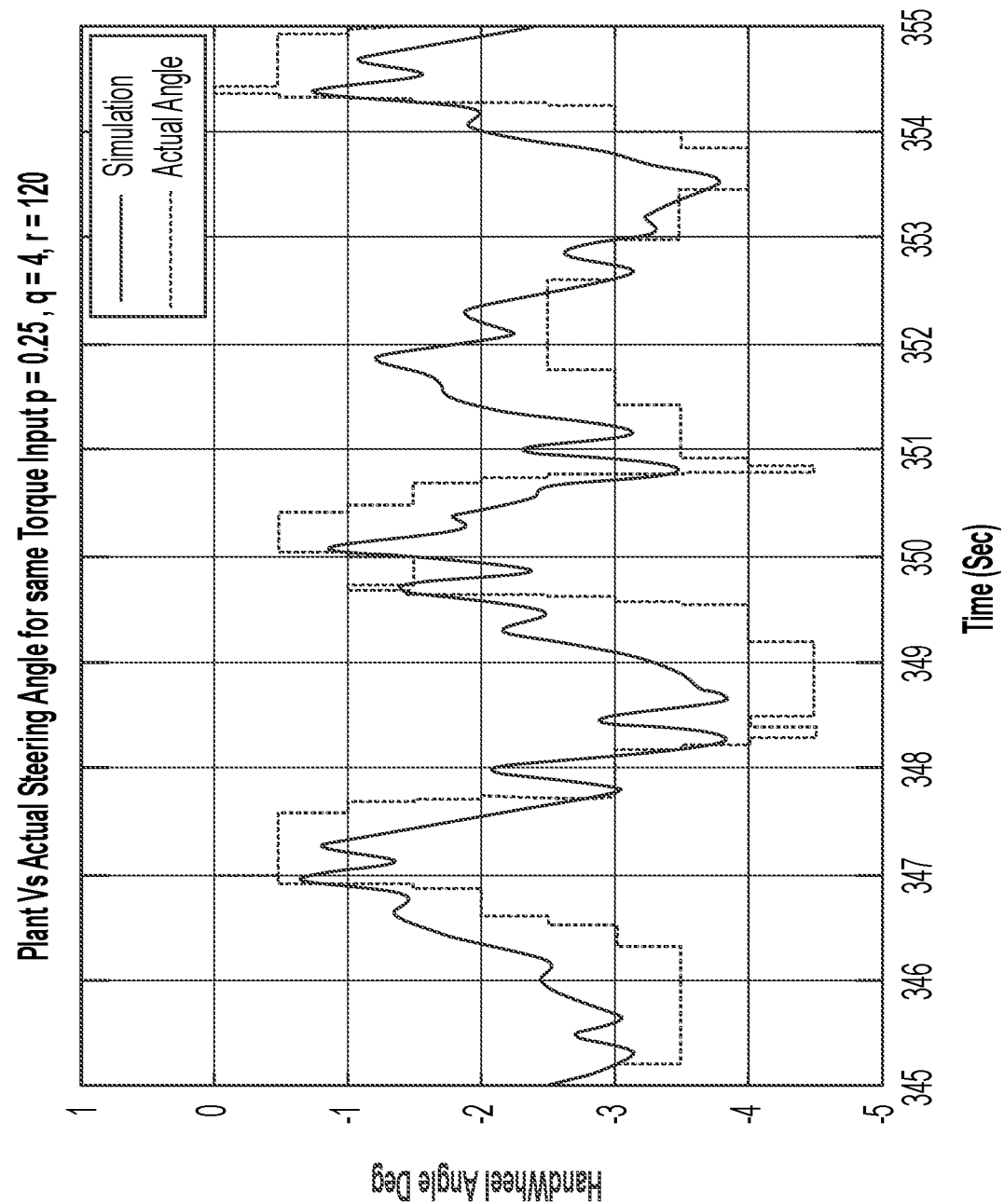
FIG. 16 is a plot of a plant versus actual steering angle comparison with new parameters.

The steering angle oscillation is observed at low amplitude and frequency. However, the plant parameter identification was done at higher amplitude of torque (e.g., 0.8 N-m). The steering rack friction is mostly dominant when steering torque input is low. Hence, the plant identification in this example may be performed multiple times (i.e., iteratively) with different parameter configurations (i.e., with low amplitude in this example). With newly derived model parameters based on this low amplitude (i.e., p=0.25, q=4, and r=120), better time-domain simulation results (with same ADAS Torque input as FIG. 15) are obtained (FIG. 16).

Figure 17:
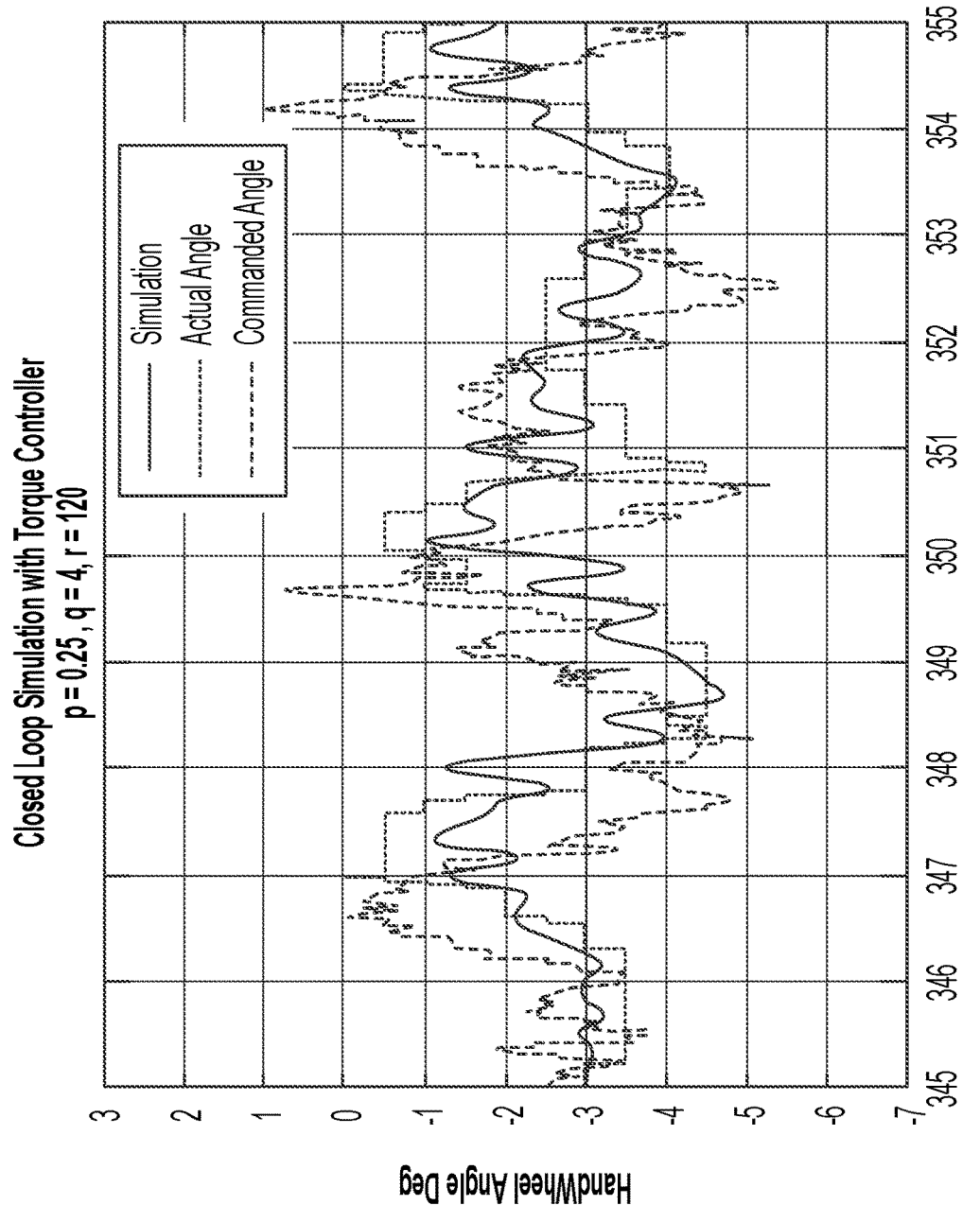
FIG. 17 is a plot of exemplary closed loop simulation results.

With the new or updated or final identified parameters, the plant (i.e., the model) has a good representation of steering response for low magnitude steering angles. Optionally, simulations may be executed with the steering angle controller and EPS plant model in a closed loop. FIG. 17 illustrates results with the steering angle controller in a closed loop. The commanded angle in the plot of FIG. 17 is the same as the commanded angle found in FIG. 7. It is visible that the simulation angle is close to the actual angle and there is a poor angle tracking. This confirms that the simulation is closely depicting the actual phenomenon.

Next, the tuning is performed using, for example, a simulation tool or other software-based environment, which is generally easier to perform and control while being cheaper than in-vehicle tuning. The results from the tuning can then be applied directly in-vehicle.

Figure 18:
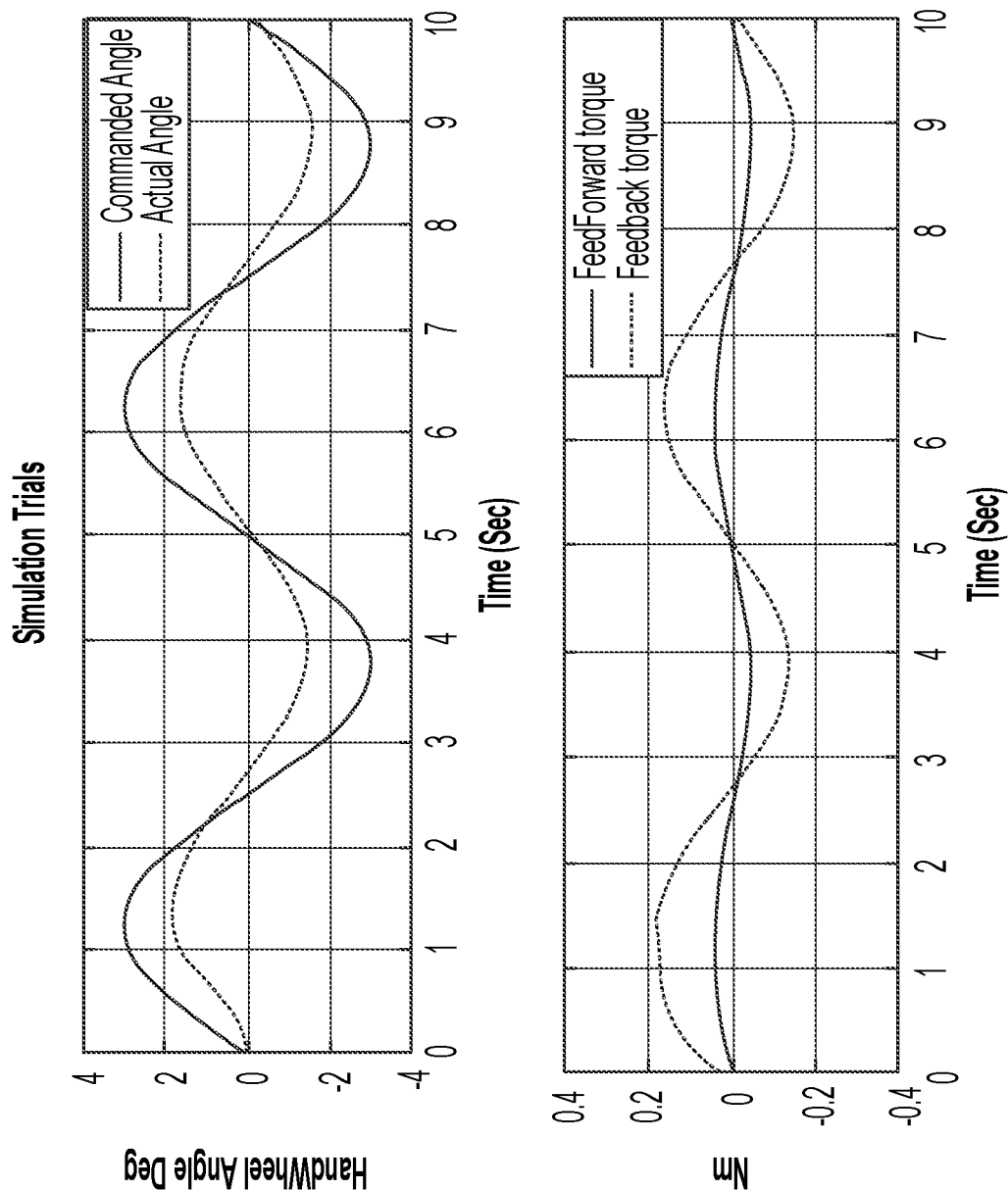
FIG. 18 are plots of an exemplary simulation trial after parameter tuning.

As discussed previously with respect to FIG. 7, a problem area in this example is steering command tracking with frequency and amplitude around 0.2 Hz and 3 degrees respectively. So, in this example, a simulation trial may begin with the base tuning, where the steering command is a sine wave of 0.2 Hz and 3 degrees amplitude (FIG. 18). Here, the current set of tuning has 290 ms of lag and is failing to achieve the peak amplitude of 3 degrees (i.e., only approximately 2.1 degrees peak-to-peak amplitude).

Next, the controller is tuned to reduce the lag and achieve the desired peak amplitude. FIG. 18 also includes a breakdown of the feedback and feedforward components of the control. It is apparent that most of the contribution in the control is from the feedback portion.

Figure 19:
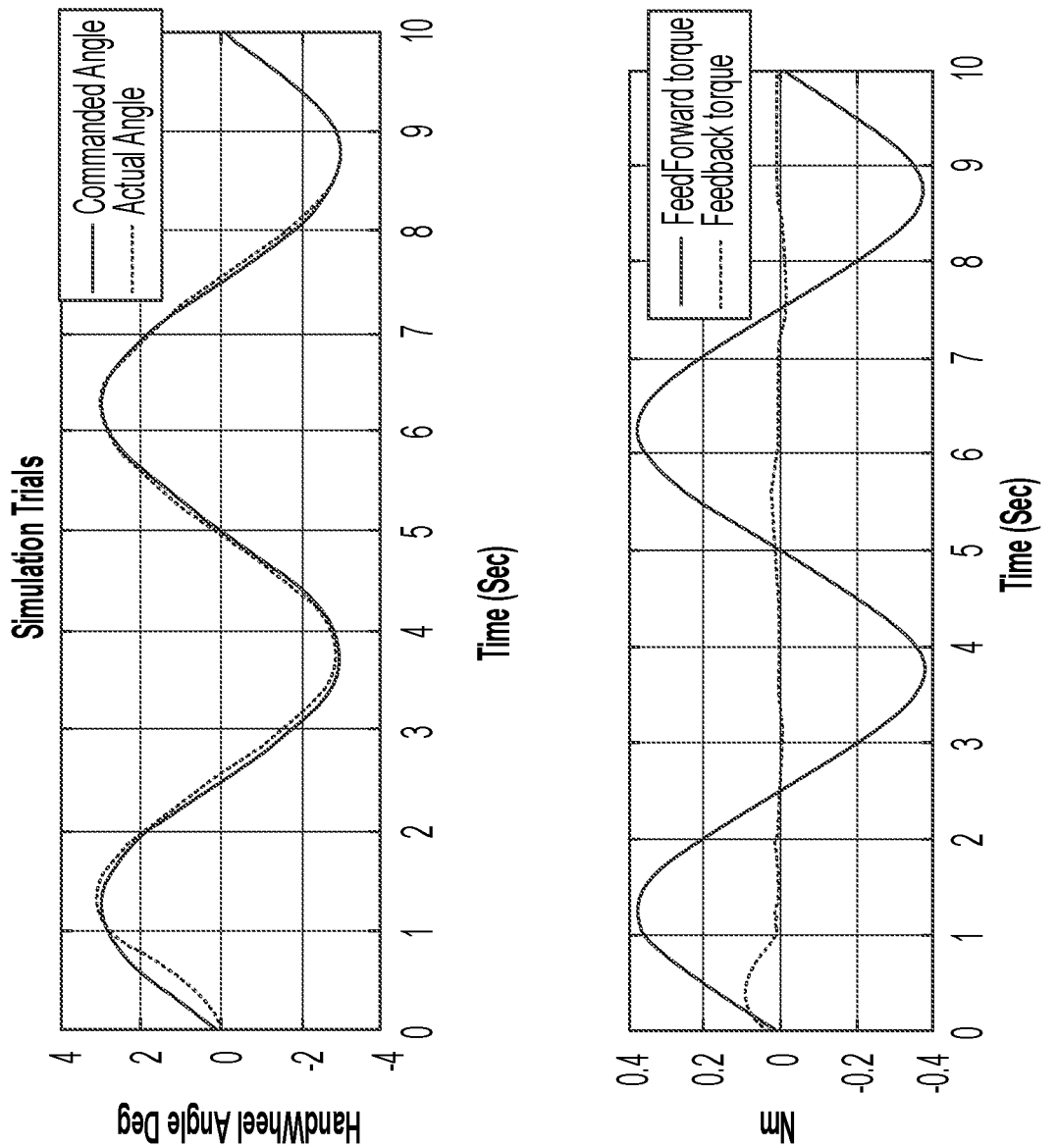
FIG. 19 are plots of an exemplary simulation trial after updated parameter tuning.

With sensor delay and CAN resolution, when the feedback portion is more dominant, more phase lag can result. Thus, in order to reduce the phase lag, optimally the feedforward component is used more. This is possible using knowledge of the EPS plant. Optionally, first the control is configured with a maximum possible feedforward portion and then next the feedback portion is added. FIG. 19 illustrates an exemplary trial where the feedforward portion is increased. It should be noted that there is minimal feedback portion. The feedback portion resolves any plant nonlinearities or disturbances. After tuning, the phase lag is minimal and the peak amplitude of 3 degrees is also reached. That is, as shown in FIG. 19, the delay is now 0 ms and the peak-to-peak amplitude is 3 degrees. Thus, the closed loop performance has significantly improved as a result of the tuning.

Figure 20:
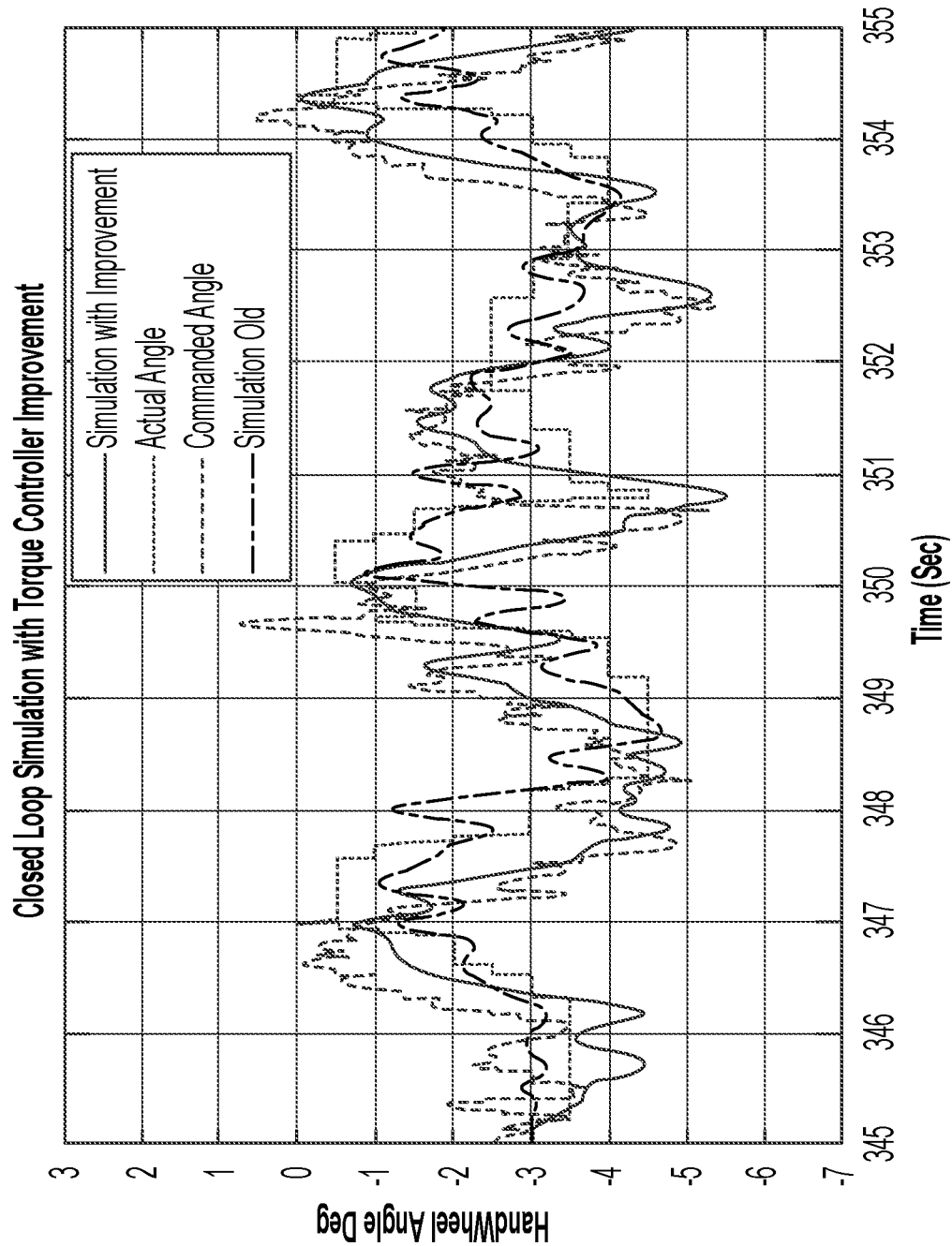
FIG. 20 is a plot of an exemplary closed loop simulation trial after updated parameter tuning.

With the improved controller tuning settings, the steering angle controller may be simulated in closed loop. FIG. 20 illustrates the simulation with a commanded angle that is the same as the commanded angle of FIG. 7. As shown in FIG. 20, with the new/updated controller, the tracking has improved.

Figure 21:
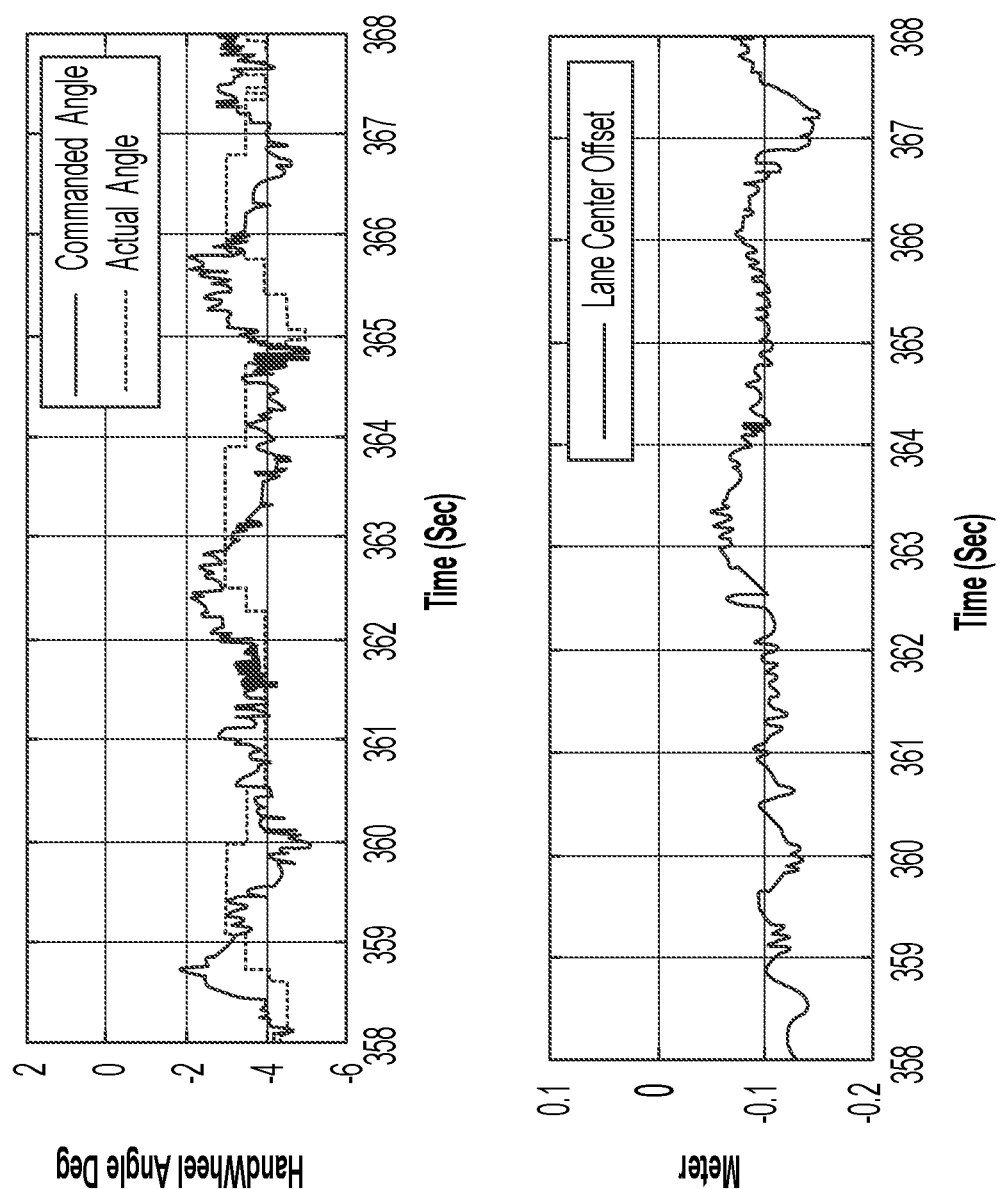
FIG. 21 are plots of in-vehicle testing results using the updated parameter tuning of FIG. 20.

After confirming that the new or updated controller setting show improvement in simulation, the settings may best tested in the vehicle, where the trajectory planning and steering controller works in a closed loop. FIG. 21 illustrates an exemplary result of an in-vehicle trial where significant improvements are observed. Here, the steering angle tracking has improved and the presence of low frequency oscillations in vehicle motion is reduced. Again, this implies that the simulation results match actual vehicle behavior.

Thus, implementations herein include systems and methods for improving steering angle tracking for ADAS functions. The implementations include frequency-domain system identification tests to determine steering dynamics of the system/vehicle under test. From this understanding, a second order transfer function is generated to match the magnitude response of the system (and optionally without the phase response). This transfer function changes significantly for low-amplitude inputs as EPS is a nonlinear system due to control gain scheduling, system friction, and other factors. System identification may be repeated for low amplitude input data. The identified system model is used to compare in-vehicle angle tracking data in time-domain. Control parameters are tuned via simulation and/or modeling software to improve the tracking performance. Further testing may then be performed in the vehicle. The implementations result in a set of controller gains which improve the steering angle tracking and minimize the low frequency oscillations in lane centering, thus improving performance. Thus, implementations herein leverage the usefulness of system identification and simulation techniques to improve control performance of closed-loop systems. Further improvements are possible in system identification by considering a higher-order EPS model to improve phase response matching. This may improve matching in-vehicle time-domain response and may result in more successful control calibration tuning.

The sensor and system may utilize aspects of the sensors and systems described in U.S. Publication No. US 2022-0135030 and/or U.S. patent application Ser. No. 17/811,312, filed Jul. 8, 2022, and/or Ser. No. 17/662,465, filed May 9, 2022, which are all hereby incorporated herein by reference in their entireties. The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in U.S. Pat. Nos. 10,099,614 and/or 10,071,687, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. The imaging array may comprise a CMOS imaging array having at least 300,000 photosensor elements or pixels, preferably at least 500,000 photosensor elements or pixels and more preferably at least one million photosensor elements or pixels arranged in rows and columns. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in U.S. Pat. Nos. 10,071,687; 9,900,490; 9,126,525 and/or 9,036,026, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A method for enhancing a vehicular driving assistance system, the method comprising:
obtaining in-vehicle test data representative of performance of the vehicular driving assistance system of a vehicle during operation of the vehicular driving assistance system;
determining, using the in-vehicle test data, a second order transfer function that models operation of the vehicular driving assistance system, wherein the second order transfer function matches a magnitude response of the in-vehicle test data;

providing a simulation environment, wherein the simulation environment simulates the vehicular driving assistance system using the second order transfer function;

determining, using the simulation environment, a feedforward contribution of the vehicular driving assistance system and a feedback contribution of the vehicular driving assistance system; and responsive to the feedback contribution being greater than the feedforward contribution, enhancing the vehicular driving assistance system at least in part via increasing the feedforward contribution such that the feedforward contribution is greater than the feedback contribution of the vehicular driving assistance system.

2. The method of claim 1, wherein the vehicular driving assistance system is a lane centering system.

3. The method of claim 1, wherein the in-vehicle test data comprises collected electric power steering test data, and wherein the electric power steering test data comprises (i) commanded steering angles and (ii) actual steering angles corresponding to the commanded steering angles.

4. The method of claim 1, wherein determining the second order transfer function comprises determining a plurality of control parameters and simulating the second order transfer function using the plurality of control parameters.

5. The method of claim 4, wherein simulating the second order transfer function comprises optimizing the second order transfer function.

6. The method of claim 5, wherein optimizing the second order transfer function comprises minimizing an objective function.

7. The method of claim 6, wherein the objective function comprises a magnitude error weight and a phase error weight, and wherein the magnitude error weight is greater than the phase error weight.

8. The method of claim 1, wherein the vehicular driving assistance system is a lane centering system, and wherein tuning the vehicular driving assistance system comprises reducing a phase lag between a commanded steering angle and an actual angle.

9. The method of claim 1, wherein tuning the vehicular driving assistance system comprises decreasing low frequency oscillations.

10. A method for enhancing a vehicular driving assistance system, the method comprising:

obtaining in-vehicle test data representative of performance of the vehicular driving assistance system of a vehicle during operation of the vehicular driving assistance system, wherein the vehicular driving assistance system comprises a lane centering system, and wherein the in-vehicle test data comprises collected electric power steering test data, and wherein the electric power steering test data comprises (i) commanded steering angles and (ii) actual steering angles corresponding to the commanded steering angles;

determining, using the in-vehicle test data, a second order transfer function that models operation of the vehicular driving assistance system, wherein the second order transfer function matches a magnitude response of the in-vehicle test data;

providing a simulation environment, wherein the simulation environment simulates the vehicular driving assistance system using the second order transfer function;

determining, using the simulation environment, a feedforward contribution of the vehicular driving assistance system and a feedback contribution of the vehicular driving assistance system; and responsive to the feedback contribution being greater than the feedforward contribution, enhancing the vehicular driving assistance system at least in part via increasing the feedforward contribution such that the feedforward contribution is greater than the feedback contribution of the vehicular driving assistance system.

11. The method of claim 10, wherein determining the second order transfer function comprises determining a plurality of control parameters and simulating the second order transfer function using the plurality of control parameters.

12. The method of claim 11, wherein simulating the second order transfer function comprises optimizing the second order transfer function.

13. The method of claim 12, wherein optimizing the second order transfer function comprises minimizing an objective function.

14. The method of claim 13, wherein the objective function comprises a magnitude error weight and a phase error weight, and wherein the magnitude error weight is greater than the phase error weight.

15. A method for enhancing a vehicular driving assistance system, the method comprising:

obtaining in-vehicle test data representative of performance of the vehicular driving assistance system of a vehicle during operation of the vehicular driving assistance system;

determining, using the in-vehicle test data, a second order transfer function that models operation of the vehicular driving assistance system, wherein the second order transfer function matches a magnitude response of the in-vehicle test data, and wherein determining the second order transfer function comprises determining a plurality of control parameters and simulating the second order transfer function using the plurality of control parameters;

providing a simulation environment, wherein the simulation environment simulates the vehicular driving assistance system using the second order transfer function;

determining, using the simulation environment, a feedforward contribution of the vehicular driving assistance system and a feedback contribution of the vehicular driving assistance system; and responsive to the feedback contribution being greater than the feedforward contribution, enhancing the vehicular driving assistance system at least in part via maximizing the feedforward contribution such that the feedforward contribution is greater than the feedback contribution of the vehicular driving assistance system.

16. The method of claim 15, wherein the vehicular driving assistance system is a lane centering system.

17. The method of claim 15, wherein the in-vehicle test data comprises collected electric power steering test data, and wherein the electric power steering test data comprises (i) commanded steering angles and (ii) actual steering angles corresponding to the commanded steering angles.

18. The method of claim 15, wherein simulating the second order transfer function comprises optimizing the second order transfer function.

* * * * *